United States Patent
Norris et al.

(10) Patent No.: US 9,036,831 B2
(45) Date of Patent: May 19, 2015

(54) AMPLIFICATION SYSTEM, CARRIER TRACKING SYSTEMS AND RELATED METHODS FOR USE IN PARAMETRIC SOUND SYSTEMS

(71) Applicant: Parametric Sound Corporation, Poway, CA (US)

(72) Inventors: Elwood G. Norris, Poway, CA (US); John Bryan Bolton, Poway, CA (US)

(73) Assignee: Turtle Beach Corporation, Poway, CA (US)

( * ) Notice: Subject to any disclaimer, the term of this patent is extended or adjusted under 35 U.S.C. 154(b) by 278 days.

(21) Appl. No.: 13/738,887

(22) Filed: Jan. 10, 2013

(65) Prior Publication Data
US 2014/0044283 A1 Feb. 13, 2014

Related U.S. Application Data

(60) Provisional application No. 61/585,112, filed on Jan. 10, 2012.

(51) Int. Cl.
*H03G 5/00* (2006.01)
*H03G 5/16* (2006.01)
*H04B 11/00* (2006.01)

(52) U.S. Cl.
CPC ............... *H03G 5/165* (2013.01); *H04B 11/00* (2013.01); *H04R 2217/03* (2013.01)

(58) Field of Classification Search
None
See application file for complete search history.

(56) References Cited

U.S. PATENT DOCUMENTS

| | | |
|---|---|---|
| 1,616,639 A | 2/1927 | Sprague |
| 1,764,008 A | 6/1930 | Crozier |
| 1,799,053 A | 3/1931 | Mache |
| 1,809,754 A | 6/1931 | Steedle |
| 1,951,669 A | 3/1934 | Ramsey |
| 1,983,377 A | 12/1934 | Kellogg |
| 2,461,344 A | 2/1949 | Olson |
| 2,855,467 A | 10/1958 | Curry |

(Continued)

FOREIGN PATENT DOCUMENTS

| | | |
|---|---|---|
| JP | H2265400 | 10/1990 |
| JP | 2005/353989 A | 12/2005 |

(Continued)

OTHER PUBLICATIONS

PCT Application PCT/US2014/018691; filing date Mar. 26, 2014; Parametric Sound Corporation; International Search Report mailed Jun. 6, 2014.

(Continued)

*Primary Examiner* — Tan X Dinh
(74) *Attorney, Agent, or Firm* — Thorpe North & Western, LLP

(57) ABSTRACT

A signal processing system for generating an ultrasonic signal from an audio signal comprises a compressor, operable to compress the audio signal, and an equalization circuit, operable to equalize the audio signal. A modulation circuit is operable to combine the audio signal with a carrier signal to produce at least one modulated carrier signal. A voltage detection and control circuit is operable to: detect a voltage of the modulated carrier signal; compare the detected voltage of the modulated carrier signal to a desired voltage; and cause the voltage of the modulated carrier signal to be adjusted if the compared voltage differs by a predetermined amount from the desired voltage.

20 Claims, 2 Drawing Sheets

(56) References Cited

U.S. PATENT DOCUMENTS

| | | |
|---|---|---|
| 2,872,532 A | 2/1959 | Buchmann et al. |
| 2,935,575 A | 5/1960 | Bobb |
| 2,975,243 A | 3/1961 | Katella |
| 2,975,307 A | 3/1961 | Schroeder et al. |
| 3,008,013 A | 11/1961 | Williamson et al. |
| 3,012,222 A | 12/1961 | Hagemann |
| 3,136,867 A | 6/1964 | Brettell |
| 3,345,469 A | 10/1967 | Rod |
| 3,373,251 A | 3/1968 | Seeler |
| 3,389,226 A | 6/1968 | Peabody |
| 3,398,810 A | 8/1968 | Clark, III |
| 3,461,421 A | 8/1969 | Stover |
| 3,544,733 A | 12/1970 | Reylek |
| 3,612,211 A | 10/1971 | Clark, III |
| 3,613,069 A | 10/1971 | Cary, Jr. |
| 3,654,403 A | 4/1972 | Bobb |
| 3,674,946 A | 7/1972 | Winey |
| 3,710,332 A | 1/1973 | Tischner et al. |
| 3,723,957 A | 3/1973 | Damon |
| 3,742,433 A | 6/1973 | Kay et al. |
| 3,787,642 A | 1/1974 | Young, Jr. |
| 3,816,774 A | 6/1974 | Ohnuki et al. |
| 3,821,490 A | 6/1974 | Bobb |
| 3,829,623 A | 8/1974 | Willis et al. |
| 3,833,771 A | 9/1974 | Collinson |
| 3,836,951 A | 9/1974 | Geren et al. |
| 3,892,927 A | 7/1975 | Lindenberg |
| 3,919,499 A | 11/1975 | Winey |
| 3,941,946 A | 3/1976 | Kawakami et al. |
| 3,997,739 A | 12/1976 | Kishikawa et al. |
| 4,056,742 A | 11/1977 | Tibbetts |
| 4,064,375 A | 12/1977 | Russell et al. |
| 4,146,847 A | 3/1979 | Otao et al. |
| 4,160,882 A | 7/1979 | Driver |
| 4,207,571 A | 6/1980 | Passey |
| 4,210,786 A | 7/1980 | Winey |
| 4,242,541 A | 12/1980 | Ando |
| 4,245,136 A | 1/1981 | Krauel, Jr. |
| 4,284,921 A | 8/1981 | Lemonon et al. |
| 4,289,936 A | 9/1981 | Civitello |
| 4,295,214 A | 10/1981 | Thompson |
| 4,314,306 A | 2/1982 | Darrow |
| 4,322,877 A | 4/1982 | Taylor |
| 4,369,490 A | 1/1983 | Blum |
| 4,378,596 A | 3/1983 | Clark |
| 4,385,210 A | 5/1983 | Marquiss |
| 4,418,404 A | 11/1983 | Gordon et al. |
| 4,419,545 A | 12/1983 | Kuindersma |
| 4,429,193 A | 1/1984 | Busch-Vishniac et al. |
| 4,439,642 A | 3/1984 | Reynard |
| 4,471,172 A | 9/1984 | Winey |
| 4,480,155 A | 10/1984 | Winey |
| 4,514,773 A | 4/1985 | Susz |
| 4,546,391 A * | 10/1985 | Kimura .................. 386/338 |
| 4,550,228 A | 10/1985 | Walker et al. |
| 4,558,184 A | 12/1985 | Busch-Vishniac et al. |
| 4,593,160 A | 6/1986 | Nakamura |
| 4,593,567 A | 6/1986 | Isselstein et al. |
| 4,613,912 A * | 9/1986 | Shibata et al. ............ 386/308 |
| 4,672,591 A | 6/1987 | Breimesser et al. |
| 4,673,888 A | 6/1987 | Engelmann et al. |
| 4,695,986 A | 9/1987 | Hossack |
| 4,716,353 A | 12/1987 | Engelmann |
| 4,751,419 A | 6/1988 | Takahata |
| 4,803,733 A | 2/1989 | Carver et al. |
| 4,823,908 A | 4/1989 | Tanaka et al. |
| 4,837,838 A | 6/1989 | Thigpen et al. |
| 4,872,148 A | 10/1989 | Kirby et al. |
| 4,885,781 A | 12/1989 | Seidel |
| 4,887,246 A | 12/1989 | Hossack et al. |
| 4,888,086 A | 12/1989 | Hossack et al. |
| 4,903,703 A | 2/1990 | Igarashi et al. |
| 4,908,805 A | 3/1990 | Sprenkels et al. |
| 4,939,784 A | 7/1990 | Bruney |
| 4,991,148 A | 2/1991 | Gilchrist |
| 5,018,203 A | 5/1991 | Sawyers et al. |
| 5,054,081 A | 10/1991 | West |
| 5,115,672 A | 5/1992 | McShane et al. |
| 5,142,511 A | 8/1992 | Kanai et al. |
| 5,153,859 A | 10/1992 | Chatigny et al. |
| 5,164,991 A | 11/1992 | Johnson et al. |
| 5,210,803 A | 5/1993 | Martin et al. |
| 5,287,331 A | 2/1994 | Shindel et al. |
| 5,317,543 A | 5/1994 | Grosch |
| 5,357,578 A | 10/1994 | Taniishi |
| 5,361,381 A | 11/1994 | Short |
| 5,392,358 A | 2/1995 | Driver |
| 5,430,805 A | 7/1995 | Stevenson et al. |
| 5,487,114 A | 1/1996 | Dinh |
| 5,539,705 A * | 7/1996 | Akerman et al. ............. 367/132 |
| 5,638,456 A | 6/1997 | Conley et al. |
| 5,684,884 A | 11/1997 | Nakaya et al. |
| 5,700,359 A | 12/1997 | Bauer |
| 5,859,915 A | 1/1999 | Norris |
| 5,885,129 A | 3/1999 | Norris |
| 5,889,870 A | 3/1999 | Norris |
| 6,011,855 A | 1/2000 | Selfridge et al. |
| 6,023,153 A | 2/2000 | Fink |
| 6,041,129 A | 3/2000 | Adelman |
| 6,106,399 A | 8/2000 | Baker et al. |
| 6,108,427 A | 8/2000 | Norris et al. |
| 6,151,398 A | 11/2000 | Norris |
| 6,188,772 B1 | 2/2001 | Norris et al. |
| 6,229,899 B1 | 5/2001 | Norris et al. |
| 6,241,612 B1 | 6/2001 | Heredia |
| 6,304,662 B1 | 10/2001 | Norris et al. |
| 6,411,015 B1 | 6/2002 | Toda |
| 6,498,531 B1 | 12/2002 | Ulrick et al. |
| 6,556,687 B1 | 4/2003 | Manabe |
| 6,584,205 B1 | 6/2003 | Croft, III et al. |
| 6,606,389 B1 | 8/2003 | Selfridge et al. |
| 6,628,791 B1 | 9/2003 | Bank et al. |
| 6,631,196 B1 | 10/2003 | Higgins |
| 6,775,388 B1 | 8/2004 | Pompei |
| 6,914,991 B1 | 7/2005 | Pompei |
| 6,940,468 B2 | 9/2005 | Aisenbrey |
| 6,975,731 B1 | 12/2005 | Cohen et al. |
| 7,158,646 B2 | 1/2007 | Bank et al. |
| 7,162,042 B2 | 1/2007 | Spencer et al. |
| 7,224,808 B2 | 5/2007 | Spencer et al. |
| 7,369,665 B1 | 5/2008 | Cheng |
| 7,536,008 B2 | 5/2009 | Howes et al. |
| 7,564,981 B2 | 7/2009 | Croft, III |
| 7,596,229 B2 | 9/2009 | Croft, III |
| 7,657,044 B2 | 2/2010 | Pompei |
| 7,667,444 B2 | 2/2010 | Mavay et al. |
| 7,729,498 B2 | 6/2010 | Spencer et al. |
| 7,850,526 B2 | 12/2010 | Mao |
| 7,957,163 B2 | 6/2011 | Hua et al. |
| 8,027,488 B2 | 9/2011 | Pompei |
| 8,106,712 B2 | 1/2012 | Lee et al. |
| 8,165,328 B2 | 4/2012 | Thomsen |
| 8,391,514 B2 | 3/2013 | Norris |
| 8,849,185 B2 * | 9/2014 | Cheung et al. ............. 455/3.06 |
| 2001/0007591 A1 | 7/2001 | Pompei |
| 2004/0047477 A1 * | 3/2004 | Bank et al. .................. 381/120 |
| 2004/0052387 A1 | 3/2004 | Norris et al. |
| 2005/0008168 A1 | 1/2005 | Pompei |
| 2005/0008268 A1 | 1/2005 | Plourde et al. |
| 2005/0086058 A1 | 4/2005 | Lemelson et al. |
| 2005/0100181 A1 | 5/2005 | Croft, III et al. |
| 2005/0152561 A1 | 7/2005 | Spencer |
| 2005/0195985 A1 | 9/2005 | Croft, III et al. |
| 2005/0220311 A1 | 10/2005 | Sun et al. |
| 2006/0025214 A1 | 2/2006 | Smith |
| 2006/0215841 A1 | 9/2006 | Vieilledent et al. |
| 2007/0127746 A1 * | 6/2007 | Matsuzawa ................ 381/191 |
| 2007/0154035 A1 | 7/2007 | Fukui |
| 2007/0211574 A1 | 9/2007 | Croft, III |
| 2008/0137881 A1 * | 6/2008 | Bongiovi ...................... 381/86 |
| 2008/0152172 A1 * | 6/2008 | Matsuzawa ................ 381/116 |
| 2008/0261693 A1 | 10/2008 | Zalewski |
| 2008/0279410 A1 | 11/2008 | Cheung et al. |
| 2010/0016727 A1 | 1/2010 | Rosenberg |

(56) References Cited

U.S. PATENT DOCUMENTS

| | | |
|---|---|---|
| 2010/0040249 A1 | 2/2010 | Lenhardt |
| 2010/0041447 A1 | 2/2010 | Graylin |
| 2010/0166222 A1 | 7/2010 | Bongiovi |
| 2010/0260362 A1* | 10/2010 | Sander et al. ............ 381/309 |
| 2010/0302015 A1 | 12/2010 | Kipman et al. |
| 2010/0303263 A1 | 12/2010 | Hiensch |
| 2011/0018710 A1 | 1/2011 | Booij et al. |
| 2011/0044467 A1 | 2/2011 | Pompei |
| 2011/0051977 A1 | 3/2011 | Losko et al. |
| 2011/0077080 A1 | 3/2011 | Meer |
| 2011/0103614 A1 | 5/2011 | Cheung et al. |
| 2011/0109248 A1 | 5/2011 | Liu |
| 2011/0212777 A1 | 9/2011 | Chen et al. |
| 2011/0216928 A1 | 9/2011 | Eisenberg et al. |
| 2012/0029912 A1 | 2/2012 | Almagro |
| 2012/0051556 A1 | 3/2012 | Pompei |
| 2012/0057734 A1 | 3/2012 | Schulein |
| 2012/0148070 A1 | 6/2012 | Norris |
| 2012/0148082 A1 | 6/2012 | Norris |
| 2014/0104988 A1 | 4/2014 | Norris |
| 2014/0133668 A1 | 5/2014 | Podoloff |
| 2014/0161282 A1 | 6/2014 | Norris |
| 2014/0161291 A1 | 6/2014 | Matsuzawa |

FOREIGN PATENT DOCUMENTS

| | | |
|---|---|---|
| WO | WO01/08449 | 2/2001 |
| WO | WO 01/15491 | 3/2001 |
| WO | WO01/52437 | 7/2001 |
| WO | WO 2008/46175 A1 | 4/2008 |
| WO | WO 2013/158298 | 10/2013 |

OTHER PUBLICATIONS

U.S. Appl. No. 13/160,048, filed Jun. 14, 2011; Elwood G. Norris; office action dated Oct. 1, 2013.
U.S. Appl. No. 13/160,051, filed Jun. 14, 2011; Elwood G. Norris; office action dated Oct. 31, 2013.
U.S. Appl. No. 13/761,484, filed Feb. 7, 2013; Elwood G. Norris; office action dated Nov. 4, 2013.
Aoki et al; Parametric Loudspeaker—Characteristics of Acoustic Field and Suitable Modulation of Carrier Ultrasound, Electronics and Communications in Japan, Part 3, vol. 74, No. 9, 1991, pp. 76-82.
Berktay et al; Possible Exploitation of Non-Linear Acoustics in Underwater Transmitting Applications, J. Sound Vib., Apr. 13, 1965, vol. 2, No. 4, pp. 435-461.
Crandall et al; The Air-Damped Vibrating System: Theoretical Calibration of the Condenser Transmitter; American Physical Society; Dec. 28, 1917; pp. 449-460.
Makarov et al; Parametric Acoustic Nondirectional Radiator; Acustica; 1992; vol. 77, pp. 240-242.
PCT Application PCT/US2013/021064; Filed Jan. 10, 2013; Parametric Sound Corporation; International Search Report Mailed May 16, 2013.
U.S. Appl. No. 13/761,484, filed Feb. 7, 2013; Elwood G. Norris.
U.S. Appl. No. 13/837,237, filed Mar. 15, 2013; Elwood G. Norris.
U.S. Appl. No. 13/863,971, filed Apr. 16, 2013; Elwood G. Norris.
U.S. Appl. No. 13/917,273, filed Jun. 13, 2013; Elwood G. Norris.
U.S. Appl. No. 13/917,315, filed Jun. 13, 2013; Elwood G. Norris.
U.S. Appl. No. 13/935,246, filed Jul. 3, 2013; Elwood G. Norris.
U.S. Appl. No. 13/160,051; filed Jun. 14, 2011; Elwood G. Norris; Office Action issued Jul. 19, 2013.
Wagner; Electrostatic Loudspeaker Design and Construction; Audio Amateur Press Publishers; 1993; Chapters 4-5; pp. 59-91.
Westervelt; Parametric Acoustic Array; The Journal of the Acoustical Society of America; Apr. 1963; vol. 35, No. 1, pp. 535-537.
Yoneyama et al.; The Audio Spotlight: An Application of Nonlinear Interaction of Sound Waves to a New Type of Loudspeaker Design; Acoustical Society of America; 1983; vol. 73, No. 5; pp. 1532-1536.
EP Application 11796319.9; filing date Jun. 14, 2011; Elwood G. Norris; European Search Report dated Jul. 29, 2014.
PCT Application PCT/US2014/037786; filing date May 13, 2014; Parametric Sound Corporation; International Search Report mailed Sep. 11, 2014.

* cited by examiner

AMPLIFICATION SYSTEM, CARRIER TRACKING SYSTEMS AND RELATED METHODS FOR USE IN PARAMETRIC SOUND SYSTEMS

RELATED APPLICATIONS

Priority is claimed of U.S. Provisional Patent Application Ser. No. 61/585,112, filed Jan. 10, 2012, which is hereby incorporated herein by reference in its entirety.

BACKGROUND OF THE INVENTION

1. Field of the Invention

The present invention relates generally to the field of signal processing systems for use in parametric sound reproduction.

2. Related Art

A parametric array in air results from the introduction of sufficiently intense, audio modulated ultrasonic signals into an air column. Self demodulation, or down-conversion, occurs along the air column resulting in an audible acoustic signal. This process occurs because of the known physical principle that when two sound waves with different frequencies are radiated simultaneously in the same medium, a modulated waveform including the sum and difference of the two frequencies is produced by the non-linear interaction (parametric interaction) of the two sound waves. When the two original sound waves are ultrasonic waves and the difference between them is selected to be an audio frequency, an audible sound is generated by the parametric interaction.

While the theory of parametric sound production has been addressed in numerous publications, commercial attempts to capitalize on this intriguing phenomenon have largely failed. Most of these efforts have proved unsuccessful because many of the basic concepts integral to such technology while, relatively easy to produce and operate in laboratory conditions, have not scaled properly in applications where relatively high (or even useful) volume output is necessary. As these technologies have been scaled to commercial levels, distortion of parametrically produced sound output results in undesirable systems.

Certain specific problems continue to arise when the emitter at issue utilizes a PVDF film. Such films typically stretch or contract in reaction to changing environmental conditions such as heat, humidity, etc. (either solely as a result of exterior, environmental conditions, or as a result of operation of the emitter, or both). This geometric change in the emitter film can result in poor performance of the emitter, or can result in damage being done to the film (and/or other components of the emitter).

SUMMARY OF THE INVENTION

In accordance with one aspect of the invention, a signal processing system for generating an ultrasonic signal from an audio signal is provided, including a compressor, operable to compress the audio signal, and an equalization circuit, operable to equalize the audio signal. A modulation circuit is operable to combine the audio signal with a carrier signal to produce at least one modulated carrier signal. A voltage detection and control circuit is operable to: detect a voltage of the modulated carrier signal; compare the detected voltage of the modulated carrier signal to a desired reference voltage; and cause the voltage of the modulated carrier signal to be adjusted if the compared voltage differs by a predetermined amount from the desired reference voltage.

In accordance with another aspect of the invention, a signal processing system for generating an ultrasonic signal from an audio signal is provided, including a compressor, operable to compress the audio signal, and an equalization circuit, operable to equalize the audio signal. A modulation circuit is operable to combine the audio signal with a carrier signal to produce at least one modulated carrier signal. A voltage detection and control circuit is operable to: detect a voltage of the modulated carrier signal; compare the detected voltage of the modulated carrier signal to a desired reference voltage; cause the frequency of the modulated carrier signal to be adjusted if the compared voltage differs by a predetermined amount from the desired voltage.

In accordance with another aspect of the invention, a method of processing an audio signal to be provided to an ultrasonic emitter is provided, including: compressing an audio signal; equalizing the audio signal; combining the audio signal with a carrier signal to produce at least one modulated carrier signal; detecting a voltage of the modulated carrier signal; comparing the detected voltage of the modulated carrier signal to a desired voltage; and causing the voltage of the modulated carrier signal to be adjusted if the compared voltage differs by a predetermined amount from the desired voltage.

In accordance with another aspect of the invention, a method of processing an audio signal to be provided to an ultrasonic emitter is provided, including: compressing an audio signal; equalizing the audio signal; combining the audio signal with a carrier signal to produce at least one modulated carrier signal; detecting a voltage of the modulated carrier signal; comparing the detected voltage of the modulated carrier signal to a desired voltage; and causing the frequency of the modulated carrier signal to be adjusted if the compared voltage differs by a predetermined amount from the desired voltage.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION

Figure 1:
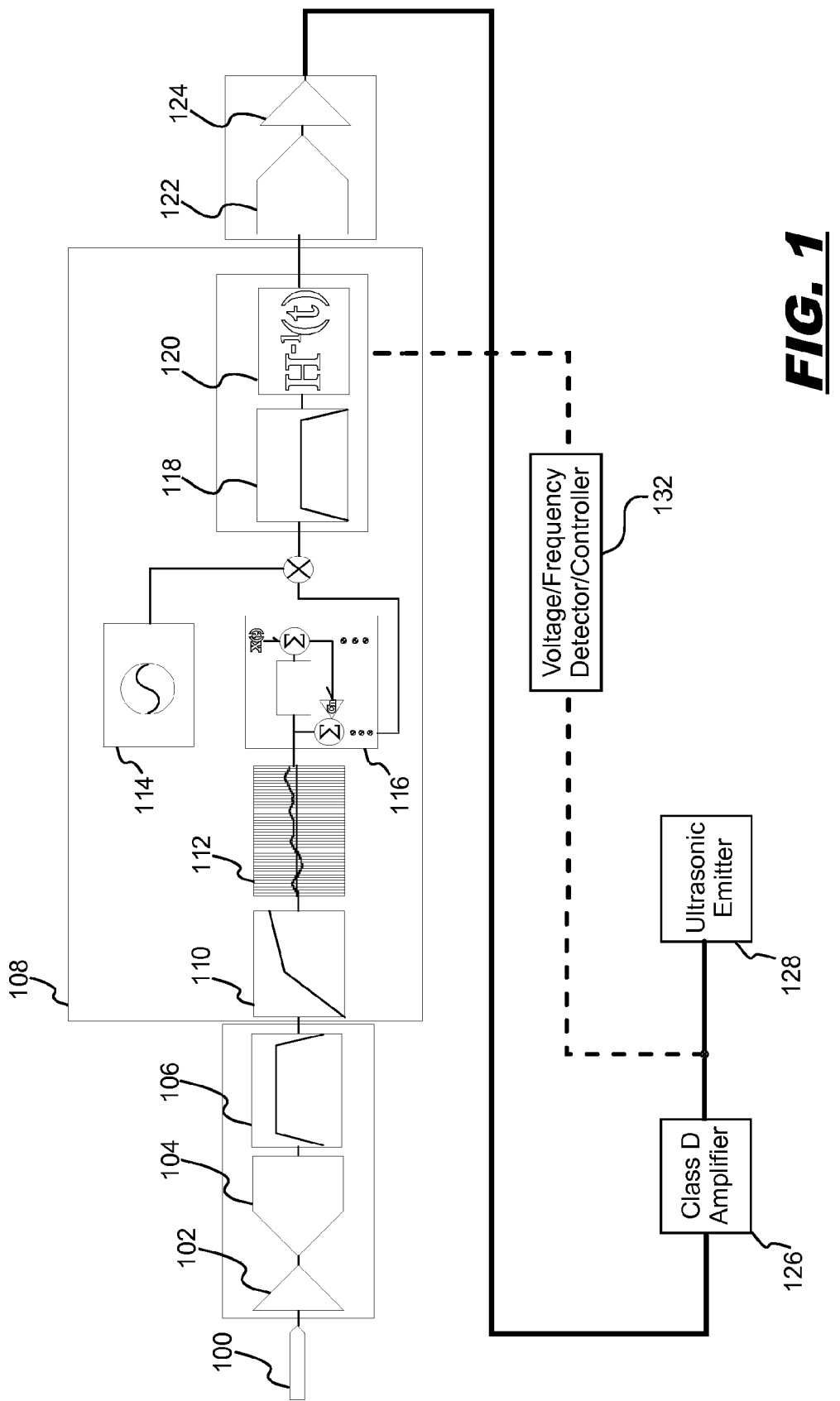
FIG. 1 is a schematic diagram of an exemplary signal processing system in accordance with one embodiment of the invention.

Reference will now be made to the exemplary embodiments illustrated in the drawings, and specific language will be used herein to describe the same. It will nevertheless be understood that no limitation of the scope of the invention is thereby intended. Alterations and further modifications of the inventive features illustrated herein, and additional applications of the principles of the inventions as illustrated herein, which would occur to one skilled in the relevant art and having possession of this disclosure, are to be considered within the scope of the invention.

DEFINITIONS

As used herein, the singular forms "a" and "the" can include plural referents unless the context clearly dictates otherwise. Thus, for example, reference to "an emitter" can include one or more of such emitters.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Invention

The present invention relates to improved signal processing systems for use in generating parametric audio signals.

FIG. 1 is provided as one exemplary manner in which the present invention can be carried out. In accordance with one aspect of the invention, an amplifying system is provided that can utilize a Hilbert transform to generate a Single Side Band ("SSB") carrier frequency. In the aspect shown, an input audio signal is first processed using compression, equalization and distortion compensation. It is then modulated (or "mixed") with a carrier signal at an exemplary carrier frequency of 44.1 kHz (or another suitable ultrasonic frequency) to form a single sideband signal for transmission into the air.

In the exemplary embodiment shown, the audio processing can proceed as follows: analog audio 100 can enter an analog gain 102. Analog gain control can modify the audio signal level before the signal is run through the Analog to Digital Converter ("ADC") 104. Band pass filtering at 106 of the digital signal can be used to remove the highs and lows that are not of interest. The digital signal can then be passed to the Digital Signal Processor ("DSP") 108.

At the DSP 108, the signal can be amplitude compressed by compressor 110 to decrease the dynamic range. This can be advantageous in that the audio can have a very high dynamic range, and if not compressed, it can overflow the digital stages to follow. Equalizer 112 can equalize the signal. The next stage is the $N^{th}$ order distortion compensator 116. While not so limited, in one aspect of the invention the order is "2" (that is, the signal is passed through the distortion compensator twice). In other embodiments, however, more (or fewer) passes may be made. The following U.S. patents provide a good background discussion of the general workings of distortion compensators that can be used in the present system: U.S. Pat. Nos. 6,584,205, 7,162,042, 7,729,498 and 7,596,229, which are each hereby incorporated herein by reference in their entirety. To the extent that any information in any of these four patents contradicts or teaches away from the present invention, that information is to be held subordinate to the present teachings.

The distortion compensator 116 can compensate for the nonlinearities of the air column (acoustic channel) into which the emitter eventually emits the modulated wave. After the distortion compensator, the processed digital audio signal can be mixed with the SSB carrier at modulator 114. The modulated data can be band pass filtered at 118, then run through the emitter correction at 120. This can correct for any distortion of the ultrasound caused by the emitter. Finally, the digital data can be passed to a DAC 122 for conversion back to analog. Gain can be added at 124 to adjust the analog signal to the level best suited to the class D amplifier 126. Gain can also be added or taken away at any point in the path (e.g., at the ADC, DSP and/or DAC).

In one aspect of the invention, a process that can be termed "Voltage Amplitude Tracking" can be utilized to optimize the performance of an emitter 128, and to protect the emitter from becoming damaged. One of the characteristics of typical emitter film is that it "warms up" while playing. The emitter is typically comprised of a step up transformer and the film (which is a capacitor). The combination of these two forms a resonant circuit. When the film "warms up," this resonant circuit can change frequency. This different frequency can be experienced by the Class D amplifier 126 as a different load. The result of this is that the voltage on the emitter can increase, and it can eventually "run away" and burn up the emitter.

To address these issues, the present system can implement voltage tracking (a generic detecting and control circuit is shown schematically at 132) which monitors the output of the Class D amplifier. The audio and carrier signal can then be converted to a DC level. Using an ADC and a microcontroller, this signal can be fed back to the DSP 108 to adjust the amplitude of the signal out of the DAC 122. In this manner, the present system can continually set and monitor the level of the signal entering the emitter.

The above-described voltage tracking system and process can be particularly advantageous when applied to a stereo system. As no two emitters are exactly the same, this process can be utilized to deliver an optimal signal to each of the emitters (e.g., balance the two emitters). In this manner, the same voltage can be delivered to each emitter, even if the two emitters differ slightly.

In addition to, or instead of, the voltage amplitude tracking system and process outlined above, the detecting and control circuit 132 can be used to implement a frequency tracking system. In this aspect, frequency tracking can be implemented utilizing substantially the same hardware as discussed above in relation to the voltage amplitude tracking regime, except that, rather than adjusting the amplitude of the signal, the frequency of the carrier can be adjusted. This can be beneficial because, as the tuned resonant circuit "warms up," its peak frequency can shift. The present system can adjust the carrier frequency to stay in the "sweet spot" of the upper side band.

The voltage and/or frequency tracking and control system outlined above can be carried out in a number of manners, using various known components. Suitable regimes for doing so will be readily appreciated by one of ordinary skill in the art having possession of this disclosure.

In one aspect of the invention, a carrier drop and carrier mute regime can be implemented with the present system. The carrier drop can be a technique by which the amplitude of the carrier is dropped if no audio is detected on the input. There are several benefits to dropping the carrier, including, without limitation, that carrier drop can reduce the power consumed but still maintain the emitter in a "warmed up" state in the case the audio returns. The system can also include a carrier mute which completely cuts the carrier if the audio is not detected for an extended period of time.

While the various components of the system described above and shown in the attached FIG. 1 can vary in position relative to one another (e.g., the signal sequence can vary from that shown), in some embodiments of the invention, the order of the components is precisely that as shown (e.g., the signal processing sequence is precisely that as shown). In other embodiments, the signal processing sequence can be only partially matched to that shown. In some embodiments, the signal processing sequence can be very important to producing clear audio output.

Figure 2:
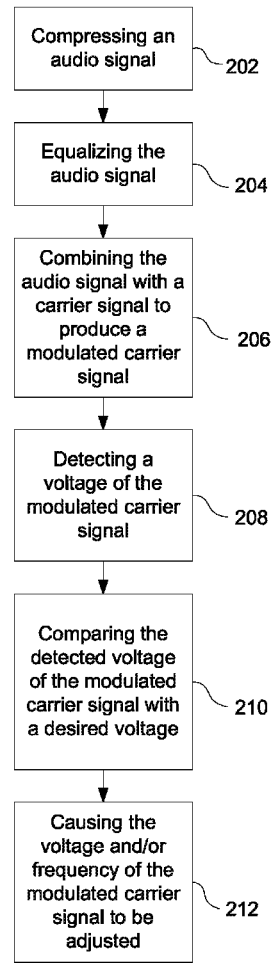
FIG. 2 is a block diagram of an exemplary method in accordance with an embodiment of the invention.

FIG. 2 illustrates on exemplary method in accordance with an embodiment of the invention. This method can begin at 202, where an audio signal (that is desired to be provided to an ultrasonic emitter) is compressed. At 204, the audio signal can be equalized. At 206, the audio signal can be combined with a carrier signal to produce at least one modulated carrier signal. At 208, a voltage of the modulated carrier signal can be detected, and compared, at 210, to a desired (or target, or reference) voltage. At 212, if the compared voltage differs by a predetermined amount from the desired voltage, the voltage or frequency of the modulated carrier signal can be adjusted. In this manner, the present technology can constantly maintain the modulated carrier signal at a target voltage or frequency. This can avoid, among other undesirable outcomes, having the signal "run away" and damage (e.g., overheat) the emitter.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the examples.

What is claimed is:

1. A signal processing system for generating an ultrasonic signal from an audio signal, comprising:
    a compressor, operable to compress the audio signal;
    an equalization circuit, operable to equalize the audio signal;
    a modulation circuit, operable to combine the audio signal with a carrier signal to produce at least one modulated carrier signal, the modulated carrier signal being of sufficient intensity so as to demodulate when emitted into a non-linear medium; and
    a voltage detection and control circuit, operable to:
        i) detect a voltage of the modulated carrier signal;
        ii) compare the detected voltage of the modulated carrier signal to a desired voltage; and
        iii) cause the voltage of the modulated carrier signal to be adjusted if the compared voltage differs by a predetermined amount from the desired voltage.

2. The signal processing system of claim 1, wherein the compressor, the equalization circuit and the modulation circuit are portions of a digital signal processing ("DSP") system, and wherein the digital signal processing system is at least partially controllable by the voltage detection and control circuit.

3. The signal processing system of claim 2, further comprising an analog-to-digital converter ("ADC") that converts an analog input audio signal to a digital signal for processing by the digital signal processing system.

4. The signal processing system of claim 3, further comprising a band pass filter, operably disposed after the ADC.

5. The signal processing system of claim 1, further comprising a distortion compensator, operable to pre-compensate for acoustic distortion produced in an air column in which the audio signal is demodulated.

6. The signal processing system of claim 1, further comprising an emitter correction circuit, to prevent emitter distortion from degrading performance of the distortion compensator.

7. A signal processing system for generating an ultrasonic signal from an audio signal, comprising:
    a compressor, operable to compress the audio signal;
    an equalization circuit, operable to equalize the audio signal;
    a modulation circuit, operable to combine the audio signal with a carrier signal to produce at least one modulated carrier signal, the modulated carrier signal being of sufficient intensity so as to demodulate when emitted into a non-linear medium; and
    a frequency detection and control circuit, operable to:
        i) detect a voltage of the modulated carrier signal;
        ii) compare the detected voltage of the modulated carrier signal to a desired voltage; and
        iii) cause the frequency of the modulated carrier signal to be adjusted if the compared voltage differs by a predetermined amount from the desired voltage.

8. The signal processing system of claim 7, wherein the compressor, the equalization circuit and the modulation circuit are portions of a digital signal processing ("DSP") system, and wherein the digital signal processing system is at least partially controllable by the frequency detection and control circuit.

9. The signal processing system of claim 8, further comprising an analog-to-digital converter ("ADC") that converts an analog input audio signal to a digital signal for processing by the digital signal processing system.

10. The signal processing system of claim 9, further comprising a band pass filter, operably disposed after the ADC.

11. The signal processing system of claim 7, further comprising a distortion compensator, operable to pre-compensate for acoustic distortion produced in an air column in which the audio signal is demodulated.

12. The signal processing system of claim 7, further comprising an emitter correction circuit, to prevent emitter distortion from degrading performance of the distortion compensator.

13. A method of processing an audio signal to be provided to an ultrasonic emitter, the method comprising:
   compressing an audio signal;
   equalizing the audio signal;
   combining the audio signal with a carrier signal to produce at least one modulated carrier signal, the modulated carrier signal being of sufficient intensity so as to demodulate when emitted into a non-linear medium;
   detecting a voltage of the modulated carrier signal;
   comparing the detected voltage of the modulated carrier signal to a desired voltage; and
   causing the voltage of the modulated carrier signal to be adjusted if the compared voltage differs by a predetermined amount from the desired voltage.

14. The method of claim 13, wherein compression, equalization and combining are performed by a digital signal processing ("DSP") system, and wherein the digital signal processing system is at least partially controllable by a voltage detection and control circuit.

15. The method of claim 14, wherein adjusting the voltage of the modulated carrier signal is performed in response to a command from the voltage detection and control circuit.

16. The method of claim 14, wherein detecting the voltage of the modulated carrier signal is performed after the modulated carrier signal is converted to an analog signal.

17. A method of processing an audio signal to be provided to an ultrasonic emitter, the method comprising:
   compressing an audio signal;
   equalizing the audio signal;
   combining the audio signal with a carrier signal to produce at least one modulated carrier signal, the modulated carrier signal being of sufficient intensity so as to demodulate when emitted into a non-linear medium;
   detecting an average voltage amplitude of the modulated carrier signal;
   comparing the detected average voltage amplitude of the modulated carrier signal to a desired reference voltage; and
   causing the frequency of the modulated carrier signal to be adjusted if the compared voltage differs by a predetermined amount from the desired voltage.

18. The method of claim 17, wherein compression, equalization and combining are performed by a digital signal processing ("DSP") system, and wherein the digital signal processing system is at least partially controllable by a voltage detection and control circuit.

19. The method of claim 18, wherein adjusting the frequency of the modulated carrier signal is performed in response to a command from the voltage detection and control circuit.

20. The method of claim 18, wherein detecting the voltage of the modulated carrier signal is performed after the modulated carrier signal is converted to an analog signal.

* * * * *